(12) United States Patent
Williams et al.

(10) Patent No.: US 6,417,698 B1
(45) Date of Patent: Jul. 9, 2002

(54) LINEARIZED DIGITAL PHASE-LOCKED LOOP METHOD

(75) Inventors: Bertrand J. Williams, Austin, TX (US); Kamal Dalmia, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/747,281

(22) Filed: Dec. 21, 2000

Related U.S. Application Data (60) Provisional application No. 60/203,616, filed on May 12, 2000.

(51) Int. Cl.[7] .............................................. H03K 19/00
(52) U.S. Cl. .............................. 326/93; 326/46; 326/96; 365/233; 365/239; 365/240
(58) Field of Search ........................... 365/154, 189.12, 365/233, 240, 239; 326/46, 93, 96, 104, 105

(56) References Cited

U.S. PATENT DOCUMENTS

| | | | | |
|---|---|---|---|---|
| 4,523,301 A | * | 6/1985 | Kadota et al. | 365/49 |
| 5,343,439 A | * | 8/1994 | Hoshimo | 365/240 |
| 5,568,416 A | * | 10/1996 | Kawana et al. | 365/49 |
| 5,671,258 A | * | 9/1997 | Burns et al. | 375/359 |
| 5,864,250 A | * | 1/1999 | Deng | 327/165 |
| 5,901,110 A | * | 5/1999 | Jang | 365/233 |
| 5,910,742 A | * | 6/1999 | Snyder et al. | 327/165 |
| 6,208,169 B1 | * | 3/2001 | Wong et al. | 326/93 |
| 6,255,880 B1 | * | 7/2001 | Nguyen | 327/277 |
| 6,301,188 B1 | * | 10/2001 | Weber et al. | 365/233 |

OTHER PUBLICATIONS

Bertrand J. Williams et al., "Linearized Digital Phase–Locked Loop", U.S. Ser. No. 09/475,660, Filed Dec. 21, 2000.

Terry D. Little et al., "Linearized Digital Phase–Locked Loop", U.S. Ser. No. 09/747,257, Filed Dec. 22, 2000.

Bertrand J. Williams et al., "Linearized Digital Phase–Locked Loop", U.S. Ser. No. 09/747,262, Filed Dec. 22, 2000.

Timothy J. Jordan et al., "Linearized Digital Phase–Locked Loop Method", U.S. Ser. No. 09/747,188, Filed Dec. 22, 2000.

Bertrand J. Williams et al., "Linearized Digital Phase–Locked Loop Method", U.S. Ser. No. 09/746,802, Filed Dec. 22, 2000.

* cited by examiner

*Primary Examiner*—Michael Tokar
*Assistant Examiner*—Khai Nguyen
(74) *Attorney, Agent, or Firm*—Christopher P. Malorana, P.C.

(57) ABSTRACT

An apparatus for determining a state of a plurality of clock signals, comprising a circuit configured to store a state of each of said plurality of clock signals upon an edge of a data signal.

22 Claims, 7 Drawing Sheets

FIG. 1
(CONVENTIONAL)

FIG. 2
(CONVENTIONAL)

LINEARIZED DIGITAL PHASE-LOCKED LOOP METHOD

This application claims the benefit of U.S. Provisional Application No. 60/203,616, filed May 12, 2000 and is hereby incorporated by reference in its entirety.

CROSS-REFERENCE TO RELATED APPLICATIONS

The present invention may relate to co-pending application U.S. Ser. No. 09/745,660, filed concurrently, which is hereby incorporated by reference in its entirety.

FIELD OF THE INVENTION

The present invention relates to a method and/or architecture for implementing phase-locked loops (PLLs) generally and, more particularly, to a method and/or architecture for implementing phase detection in linearized digital PLLs.

BACKGROUND OF THE INVENTION

Conventional approaches for implementing PLLs include the bang-bang approach which comprises taking snapshots of the phase error with respect to edges of incoming data. The bang-bang approach corrects on every data edge based solely on the direction (polarity) of the offset. As a result, a bang-bang system is never truly "locked". In the best case, a bang-bang system is nearly locked and makes a correction at every data edge (i.e., clocks are either switched clockwise or counter clockwise depending on the polarity of the phase offset). The bang-bang approach has the disadvantage of introducing excessive jitter in the resulting recovered clock since the clock is being shrunk or expanded at every edge.

Figure 1:
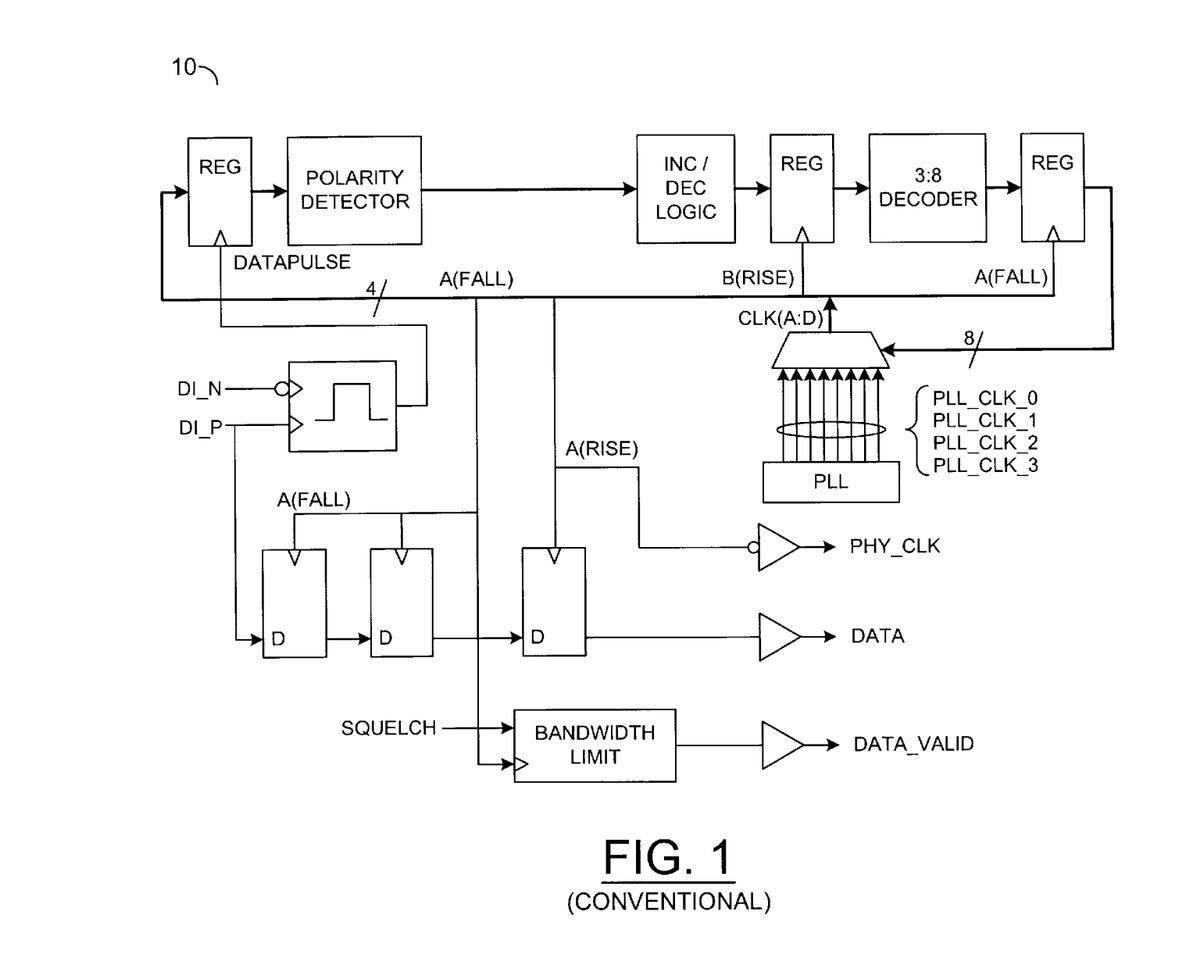
FIG. 1 is a block diagram of a conventional bang-bang system.

Referring to FIG. 1, a circuit 10 implementing a conventional bang-bang approach for constructing digital phase locked loops is shown. The circuit 10 involves the use of over sampling methods to determine in which quadrant of the clock the data edge resides. The quadrant information is then applied to an adjustment mechanism which moves the clock the appropriate direction at each interval. No information associated with the magnitude of phase error is retained or utilized. Polarity of the error and presence of a data transition are the only information used to adapt the phase of the clock to the incoming datastream.

Figure 2:
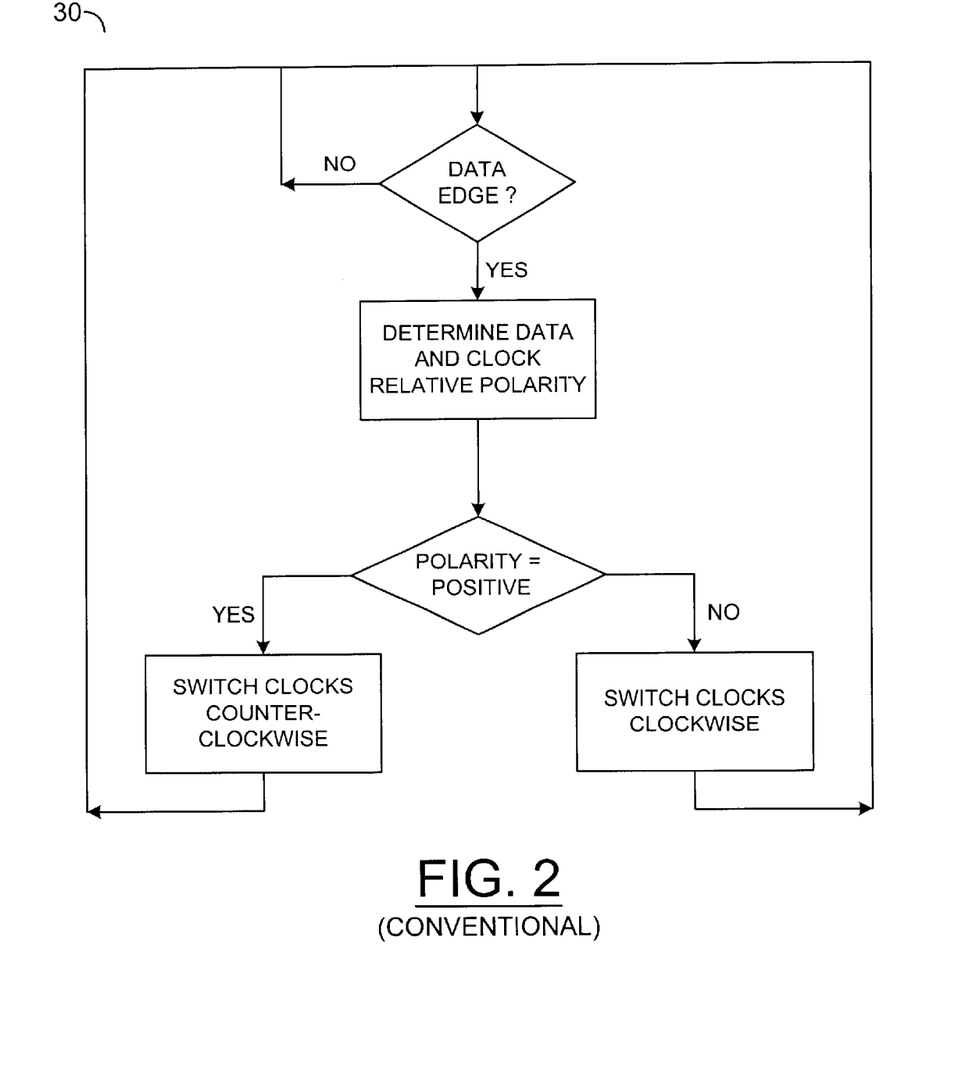
FIG. 2 is a flow diagram illustrating the operation of the conventional bang-bang circuit of FIG. 1.

Referring to FIG. 2, a flow diagram 30 illustrating the operation of the conventional bang-bang circuit 10 is shown. The circuit 10 checks for a data edge and determines the relative polarity between the data and clock. If the polarity of the data relative to the clock is positive, the clocks are switched counterclockwise. If the polarity of the data relative to the clock is negative, the clocks are switched clockwise.

Since the circuit 10 does not use magnitude information, a transfer function is exhibited at the phase detector which has the characteristics typical of a bang-bang approach. Such detectors have an inability to tolerate large input signal distortion, such as the distortion that may be found at the end of typical wired media.

SUMMARY OF THE INVENTION

The present invention concerns an apparatus for determining a state of a plurality of clock signals, comprising a circuit configured to store a state of each of said plurality of clock signals upon an edge of a data signal.

The objects, features and advantages of the present invention include providing a method and/or architecture for implementing a phase detector in a linearized digital PLL that may (i) reduce area requirements for sampling and encoding circuitry and/or (ii) reduce power requirements in high speed systems.

BRIEF DESCRIPTION OF THE DRAWINGS

These and other objects, features and advantages of the present invention will be apparent from the following detailed description and the appended claims and drawings in which:

Detailed Description of the Preferred Embodiments

Figure 3:
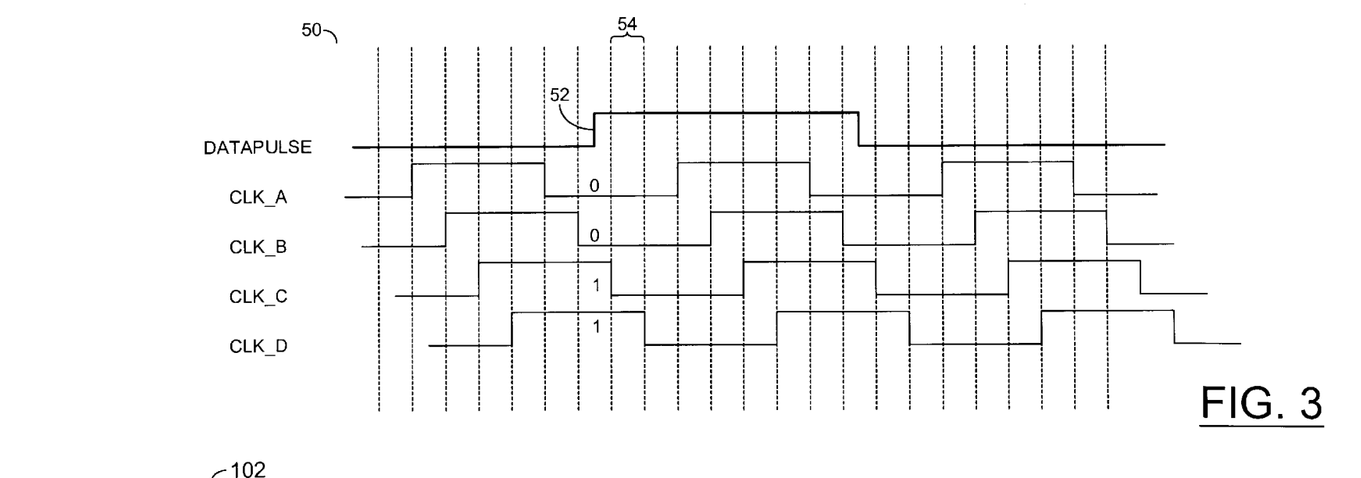
FIG. 3 is a timing diagram illustrating example waveforms of a digital clock recovery system.

Referring to FIG. 3, a timing diagram 50 illustrating example waveforms of a digital clock recovery system is shown. In a digital clock recovery system, a phase relationship between data edges and a number of clocks may be calculated and converted into a binary number that indicates a magnitude and direction (polarity) of an offset. A rising edge 52 of a signal (e.g., DATA) may occur in a region 54 where a signal (e.g., CLK_A) is in a logic LOW state(or "0"), a signal (e.g., CLK_B) is in a logic LOW state, a signal (e.g., CLK_C) is a logic HIGH state (or "1"), and a signal (e.g., CLK_D) is in a logic HIGH state. In general, there are eight such regions where the edge of the signal DATA may be at any given instance.

Figure 4:
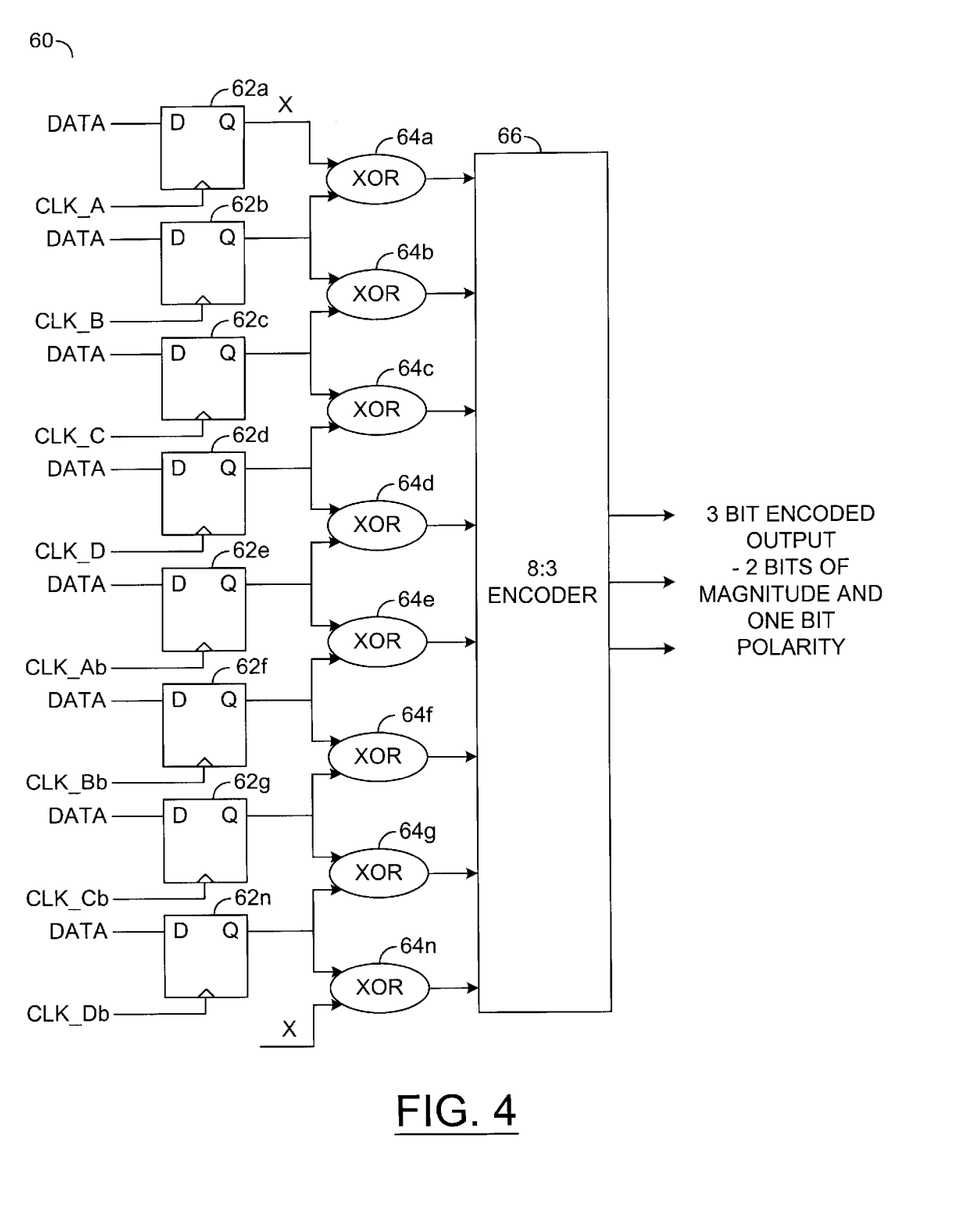
FIG. 4 is a block diagram illustrating a phase detector for generating polarity and magnitude information.

Referring to FIG. 4, a detailed block diagram of a circuit 60 illustrating a phase detector implemented to generate both polarity an magnitude information is shown. The circuit 60 may be configured to receive the signals DATA, CLK_A, CLK_B, CLK_C, CLK_D, and a number of complement signals (e.g., CLK_Ab, CLK_Bb, CLK_Cb, and CLK_Db). The phase detector 60 may be configured to generate a three bit encoded output in response to the signals DATA, CLK_A, CLK_B, CLK_C, CLK_D, CLK_Ab, CLK_Bb, CLK_Cb, and CLK_Db.

The circuit 60 may comprise a number of memory elements 62a–62n, a number of gates 64a–64n, and an encoder circuit 66, where n is an integer equal to the number of true and complement clock signals. The memory elements 62a–62n may be implemented as D-type flip-flops. The gates may be implemented as two-input Exclusive OR gates. However, other types of flip-flops and/or gates may be implemented accordingly to meet the design criteria of a particular application. The signal DATA may be presented to a D-input of the memory elements 62a–62n. The signals CLK_A, CLK_B, CLK_C, CLK_D, CLK_Ab, CLK_Bb, CLK_Cb, and CLK_Db may be present to a clock input of the memory elements 62a–62n, respectively. A Q-output of the memory elements 62a–62n may be presented to (i) a first input of the gates 64a–64n, respectively, and (ii) a second input of different one of the gates 64a–64n. An output of each of the gates 64a–64n may be present to an input of the encoder 66. The encode 66 may be configured to generate an encoded output comprising polarity and magnitude information. For example, when n=8, the encoder 66 may be configured to generate a 3-bit encoded output. The circuit 60 generally obtains the phase relationship between the signal DATA and a number of clock signals CLK_A—CLK_N by sampling the signal DATA by the clock signals CLK_A—CLK_N and CLKAb-CLKNb to obtain a 2N bit number. The 2N bit number may be encoded into a $\log_2$ (2N)binary representation of the phase relationship between the signal DATA and the clocks. The circuit 60 has a disadvantage of requiring a large number of gates.

Figure 5:
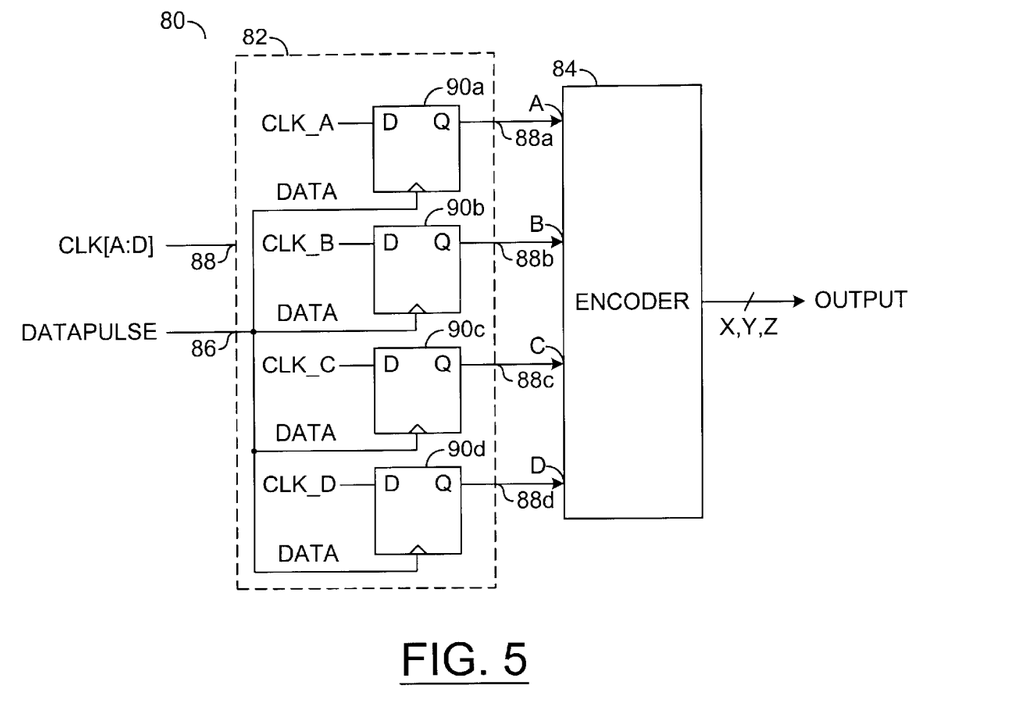
FIG. 5 is a block diagram of a preferred embodiment of the present invention.

Referring to FIG. 5, a detailed block diagram of a circuit 80 illustrating a preferred embodiment of the present invention is shown. The circuit 80 may be implemented as a phase detector circuit of a digital phase-locked loop circuit. The circuit 80 may comprise a register 82 and an encoder 84. The register 82 may have an input 86 that may receive the signal DATA, an input 88 that may receive a number of clock signals (e.g., CLK(A:D)), and a number of outputs 90a–90d that may present a signal to a respective input of the encoder 84. Although an example with four clock signals is shown, the circuit 80 may be scaled accordingly for greater or fewer clock signals. The register 82 may be configured to generate the signals presented at the outputs 88a–88d by sampling the signals CLK(A:D) by the signal DATA.

The register 82 may comprise a number of memory elements 90a–90d. In one example, the memory elements 90a–90d may be implemented as D-type flip-flops. However, other types and numbers of registers, latches, flip-flops, etc. may be implemented accordingly to meet the design criteria of a particular application. When the number of clocks sampled is four, the register 82 may present a four bit wide representation of the phase relationship between the clocks and the signal DATA. The encoder 84 may be configured to encode the four bit wide (e.g., inputs A, B, C and D) representation into a three bit wide (e.g., outputs X, Y and Z) binary representation. In general, both the sampling portion 82 and the encoding portion 84 are considerably smaller in size than the corresponding portions of the circuit 60 of FIG. 4. In high speed systems, the smaller size may provide significant power savings. The following truth table may define the logic of the encoder 84:

| InPuts | | | | Outputs | | |
|---|---|---|---|---|---|---|
| A | B | C | D | X | Y | Z |
| 0 | 1 | 1 | 1 | 1 | 1 | 1 |
| 0 | 0 | 1 | 1 | 1 | 1 | 0 |
| 0 | 0 | 0 | 1 | 1 | 0 | 1 |
| 0 | 0 | 0 | 0 | 1 | 0 | 0 |
| 1 | 0 | 0 | 0 | 0 | 0 | 0 |
| 1 | 1 | 0 | 0 | 0 | 0 | 1 |
| 1 | 1 | 1 | 0 | 0 | 1 | 0 |
| 1 | 1 | 1 | 1 | 0 | 1 | 1 |

Figure 6:
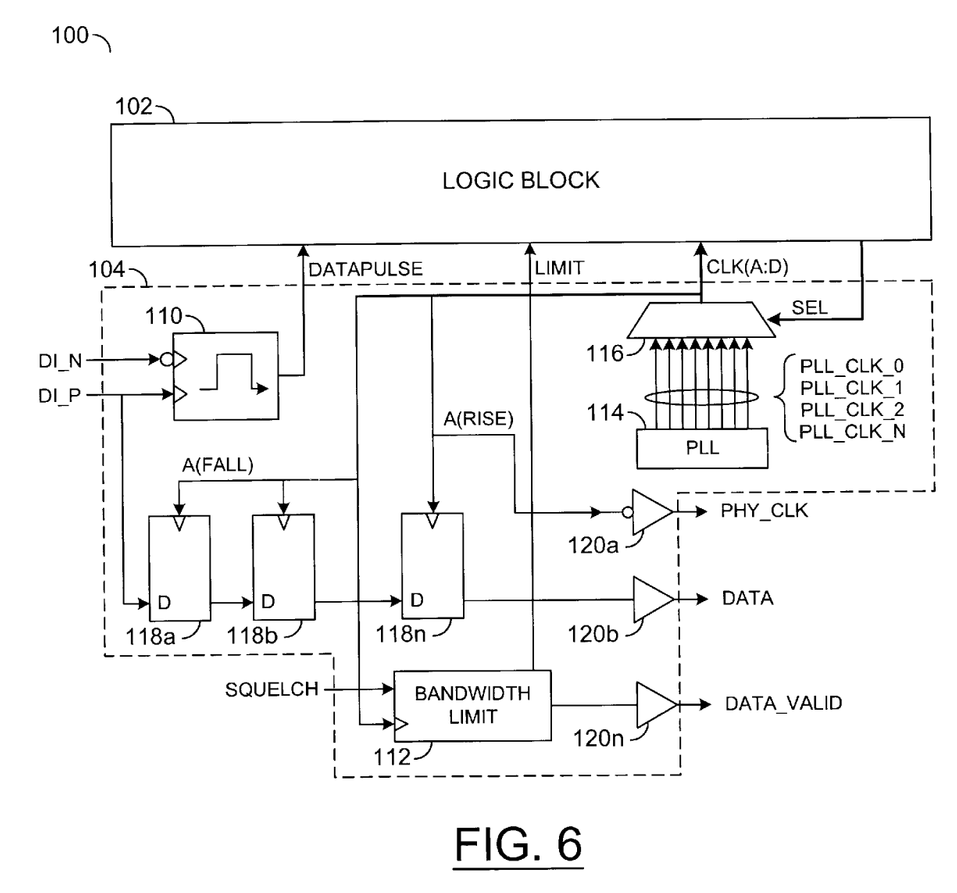
FIG. 6 is a block diagram illustrating a linearized digital phase-locked loop implemented in accordance with the present invention.

Referring to FIG. 6, a block diagram of a circuit 100 is shown implementing a linearized digital phase-locked loop in accordance with a preferred embodiment of the present invention. The circuit 100 generally comprises a logic block (or circuit) 102 and a control block (or circuit) 104. The logic block 102 may comprise a phase detector implemented similarly to the circuit 80. The circuit 104 may be implemented as a control circuit configured to adjust the frequency of an output clock.

The circuit 104 generally comprises a circuit 110, a circuit 112, a circuit 114 and a circuit 116. The circuit 104 may also comprise a number of memory elements 118a–118n and a number of buffers 120a–120n. The circuit 110 may be implemented as an edge detection circuit. The circuit 110 may present a signal (e.g., DATAPULSE) to the logic block 102. The signal DATAPULSE may be generated in response to a signal (e.g., DI_N) and a signal (e.g., DI_P). The signals DI_P and DI_N may be a complementary pair of data signals. In one example, the circuit 110 may be configured to generate a pulse signal in response to a transition of the data signals DI_P and DI_N.

The circuit 112 may be implemented as a bandwidth limiting circuit. The circuit 112 may present a signal (e.g., LIMIT) to the logic block 102. The signal LIMIT may limit a bandwidth of the logic block 102. The circuit 114 may be implemented, in one example, as a phase lock loop (PLL). The PLL circuit 114 may present a number of clock signals (e.g., PLL_CLK_0-PLL_CLK_N) to the circuit 116. The circuit 116 may be implemented as a multiplexer circuit. The circuit 116 may present a number of signals (e.g., CLK (A:D)). In one example, the circuit 116 may be implemented as a multiple input multiplexer that may present an output signal based on a control signal (e.g., SEL) generated by the logic block 102. The circuit 116 may be configured to select a number of the signals PLL_CLK_0-PLL_CLK_N for presentation as the signals CLK(A:D) in response to the signal SEL.

The logic block 102 may implement a digital phase-detector that may be used as an integral part of a digital phase-locked loop for data and clock recovery circuits. Specifically, the digital phase-detector 102 may be used for linearization of the phase-detection and loop mechanisms to overcome the disadvantages associated with conventional systems (discussed in the background section of the present application).

Figure 7:
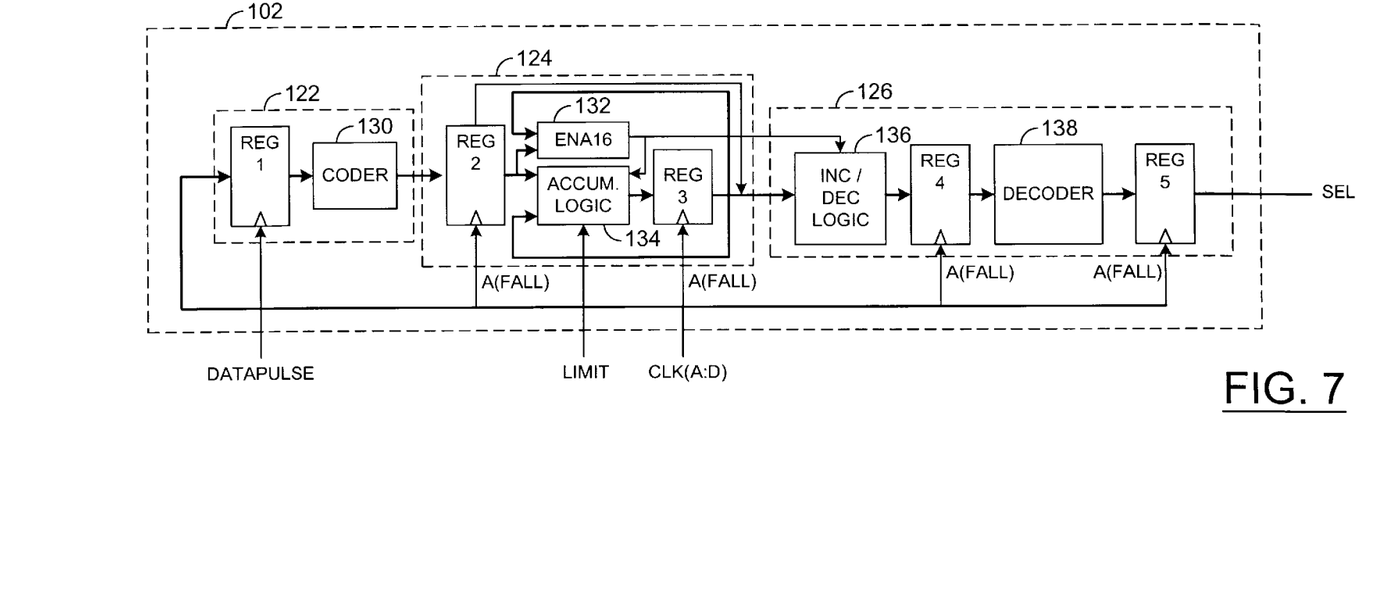
FIG. 7 is a block diagram of a logic block of FIG. 3.

Referring to FIG. 7, a more detailed diagram of the logic circuit 102 is shown. The logic circuit 102 generally comprises three major blocks, a phase-detector 122, a filter 124, and a phase-switcher 126. A preferred embodiment of the present invention, in its basic form, presumes a multi-phase reference clock controlled by the phase-switcher 126. The phase-detector 122 may be configured to detect the presence of a data-transition and compare the relative phase of the data-edge with that of the clock signals CLK(A:D). The phase detector 122 may be implemented using the circuit 80 of FIG, 5. The relative phase is reduced to a numerical representation of the magnitude of the phase error between the data edge and the signals CLK(A:D), (e.g., between −N and +N, where N is the number of phases controlled by the phase-switcher 126).

The filter 124 may be implemented as a simple digital arithmetic accumulator that maintains an accumulated relative error and generates a signal to enable the movement of the phase-switcher clock-phase and a signal to indicate the direction (e.g., increment/decrement) of such phase-movement. By combining the functions, the phase of a clock out of the phase-switcher 126 is continually aligned to the incoming datastream allowing a simple sampling arrangement to recover the data bits. The functional architecture closely emulates an analog system, where the phase-detector and the filter block are similar, but represented by timevoltage-current analog circuits and the phase-switcher 126 is typically replaced by a VCO, or variable delay-line in a delay-locked loop (DLL). The phase detector 122 can transmit a number discrete digital levels, where a linear system may transmit a theoretically infinite resolution of signal into the filter 124.

The filter 124 may accumulate digital numerical values. In a linear system, a capacitance element is utilized to integrate charge into voltage. The phase-switcher 126 combined with a multi-phase reference clock signals PLL_CLK0—PLL_CLK_N and CLK(A:D) effectively emulates VCO performance by allowing continual, though discrete-increment movement, of the clock phase edges into the system.

The phase detector 122 may comprise a register (e.g., REG1) and a circuit 130. The filter 124 may comprise a register (e.g., REG2), a circuit 132, a logic circuit 134, and a register (e.g., REG3). The phase switcher 126 may comprise a logic circuit 136, a register (e.g., REG4), a circuit 138 and a register (e.g., REG5). The circuit 130 may be implemented as a coder circuit. The circuit 132 may be implemented as an enable look ahead circuit. The circuit 134 may be implemented as an accumulation logic circuit. The circuit 136 may be implemented as an increment/decrement logic circuit 136. The circuit 138 may be implemented as a decoder circuit.

The register REG1 may be implemented similarly to the register 82 of FIG. 5. The register REG1 generally receives the signals DATAPULSE and CLK(A:D) from the circuit 104. An output of the register REG1 may be presented to an input of the circuit 130. The circuit 130 may be implemented similarly to the circuit 84 of FIG. 5. The circuit 130 may have an output that may present a signal to an input of the REG2. The circuit 130 may generate the signal by encoding the polarity and magnitude of the phase differences between the data-edge and the signals CLK(A:D). The register REG2 may have an output that may present a signal to a first input of the circuit 132 and a first input of the circuit 134. The circuit 132 may have an output that may present a signal to the circuit 134 and a first input of the circuit 136. The circuit 134 may have an output that may present a signal to an input of the register REG3. The register REG3 may present a signal to inputs of the circuits 132, 134 and 136. An output of the register REG2 may be presented to an input of the circuit 136. An output of the circuit 136 may be coupled to an input of the circuit 138 by the register REG4. The registers REG2, REG3, REG4 and REG5 generally have a control input that generally receives the signal CLK(A). The register REG5 generally presents the signal SEL in response to an output of the circuit 138.

The circuit 100 generally allows for the use of the detected phase error magnitude to emulate a linearized system having the characteristics at a macro level which approach a pure linear system. However, the circuit 100 may have resolution intervals allowing the simplicity of digital mechanisms to be implemented.

The advantage of the linearized system 100 over the pure digital PLL may be demonstrated by observation of the operation of the system 100 under high-levels of data stream distortion, particularly the sorts of distortion associated with media induced effects, (e.g., systematic jitter, duty-cycle-distortion (DCD) and data-dependant-jitter (DDJ)).

Systematic jitter has the characteristics that the predominant effect is one of having few data transitions at the average location of the data edge. Rather, the data transitions may have a bi-modal distribution of the edge placements of the datastream at some −M/+M location. When the data edges predominantly occur at locations −M and +M relative to the average location (or zero-phase) then any misalignment with the local clock cannot be determined by any single data edge placement.

The operation of the present invention may be easily demonstrated by considering a simple sequence. Presume an incoming datastream DI_N and DI_P is distorted such that the edges occur at −J nS and +K nS, where 0 nS is the ideal non-distorted location of the edges, or the 'average' location of the edges. Further presume that mechanisms associated with real systems during acquisition and normal operation are such that the magnitude of J and K are not necessarily equal. The conventional 'bang-bang' digital PLL would see −J1, +K1, −J2, +K2, −J3, +K3, etc. and generate a response, as a control to the internal phase-switcher, which would cause the clock to decrement in phase, then increment, decrement, increment, etc, no matter what the values of J and K.

In contrast, the present invention may accumulate (or sum) the magnitude as −J1+K1−J2+K2−J3+K3 and respond when the accumulation goes beyond some threshold. If J=K then the accumulation would net zero on a continuous basis. For magnitudes of −J+K greater than (clock period) /2N (where 2N is the number of clock phases available for selection by the phase-switcher, as mentioned above) the system 100 would accumulate a small numerical average corresponding to the 'average' alignment 'around' the ideal zero-phase location, just as does a linear system. Thus, the system 100 would be able to adapt to frequency-tracking conditions associated with real systems, whereas the conventional approaches discussed in the background section would fail beyond some level of distortion magnitude.

The theoretical fail point for the conventional system is ½ the clock period of distortion of the incoming datastream, then reduced by addition of general system non-idealities, matching, and the presence of random jitter components in the datastream. The theoretical limits of operation of the circuit 100 are generally limited only by the numerical resolution N, associated with the detection resolution increments, and for cases of N=4, about ¾ clock-period, also as above reduced by system non-idealities, matching, and random jitter in the datastream. The ability to tolerate an additional ¼ clock-period of data distortion can make the difference between a device that is marginal or does not function with a particular media, and one that exhibits infinitely low bit-error-rates.

For the USB 2.0 specification (published April 2000 and hereby incorporated by reference in its entirety), a conventional bang-bang digital PLL will be marginal, if operable, to the system specifications for datastream distortion. Alternative implementations of the phase-detector may vary primarily in the exact construction of the numerical slicing/detection method or conversion of phase-alignment to a numerical value or input to the accumulator. Variants of the filter block 124 are ordinarily limited to the magnitude of the accumulator threshold level detection for enabling a phase-adjustment of the phase-switcher block 126. Other filter clock variants may allow for the effective detection limit to adapt to acquisition conditions to allow for combination of fast acquisition and maximum tolerance when acquired. The implementation variants of the phase-switcher 126 and reference clock functions are predominantly associated with the number of raw clock phases available (e.g., 2N) for selection-switching, and the incrementer/decrementer and associated clock-multiplexer design and timing.

The circuit 100 implements a dual bandwidth linearized digital PLL similar to that described in co-pending provisional application (Ser. No. 60/203,677) which is hereby incorporated by reference in its entirety.

A decision is then made depending on the current operation mode of the system. If the system 100 is currently in the high bandwidth (or acquire) mode then if the magnitude of the offset value is zero then no further action is taken (e.g., the Inc/Dec logic 136 is not enabled). If the magnitude of the offset is non-zero then the polarity of the offset is passed directly to the Inc/Dec logic 136, (e.g., the Inc/Dec logic 136 is enabled). The value of the register REG4 is then incremented or decremented as indicated by the polarity of the offset value on the next falling edge of the clock signal CLKA(full). The register REG4 and the Inc/Dec logic 136 implement a 3-bit counter with wrap around and single adjustment limits. The value of the register REG4 is then decoded into a 1 of 8 value that is clocked into the register REG5 on the next falling edge of CLKA. When the register REG5 is updated the select values into the PLL clock select multiplexers 116 are changed, thus changing the mapping between the input PLL clocks (PLL_CLK_0—PLL_CLK_N) and the internally sampled clocks CLK[A–D]. For example, where the input PLL clocks are all 480 MHz clocks with 1/8 bit of phase difference, the selection may result in a 1/8 bit time phase adjustment on the sample clock CLKA. If the system 100 is currently in the low bandwidth (or tracking) mode, then the offset is added to the value currently in the accumulator 134. The result is clocked into the register REG3. The logic circuit 132 performs a look-ahead function and if the offset being added to accumulator 134 will cause either an overflow or underflow then the Inc/Dec Logic 136 is enabled. The Inc/Dec logic 136 then updates the register REG4 as determined by the value of the most significant bit of the register REG3, which represents the polarity of the value currently stored in the accumulator.

The value of the Inc/Dec logic 136 is then decoded into a 1 of 8 value that is clocked into the register REG5 on the next falling edge of CLKA. When the register REG5 is updated select values into the PLL clock select multiplexers are changed, thus changing the mapping between the input PLL clocks PLL_CLK_0—PLL_CLK_N and the internally sampled CLK[A–D]. Using the example where the input PLL clocks PLL_CLK_0—PLL_CLK_N are all 480 MHz clocks with 1/8 bit of phase difference, a 1/8 bit time phase adjustment on the sample clock CLKA may be made.

The apparatus for determining the operational mode (e.g., HIGH or LOW bandwidth) is the bandwidth limit logic 112. The logic 112 may be implemented, in one example, as a 4-bit counter that is cleared by an external signal and clocked by the falling edge of CLKA. However, other bit width counters may be implemented accordingly to meet the design criteria of a particular implementation. The counter may assert the signal DATAVALID at a first count (e.g., seven bit times) and assert the bandwidth limit signal LIMIT at a second count (e.g., fifteen bit times). The assertion of the bandwidth limit signal LIMIT changes the mode of the PLL from the high bandwidth "acquire" mode to the low bandwidth "tracking" mode. The output clock is generally the inversion of the current CLKA. The data is generally recovered by sampling the data stream twice with a falling edge of the signal CLKA (e.g., through two D-type flip-flops) and then a last time with a rising edge of the signal CLKA (e.g., through a third D-type flip-flop) to ensure that it is synchronized with the output recovered clock.

Figure 8:
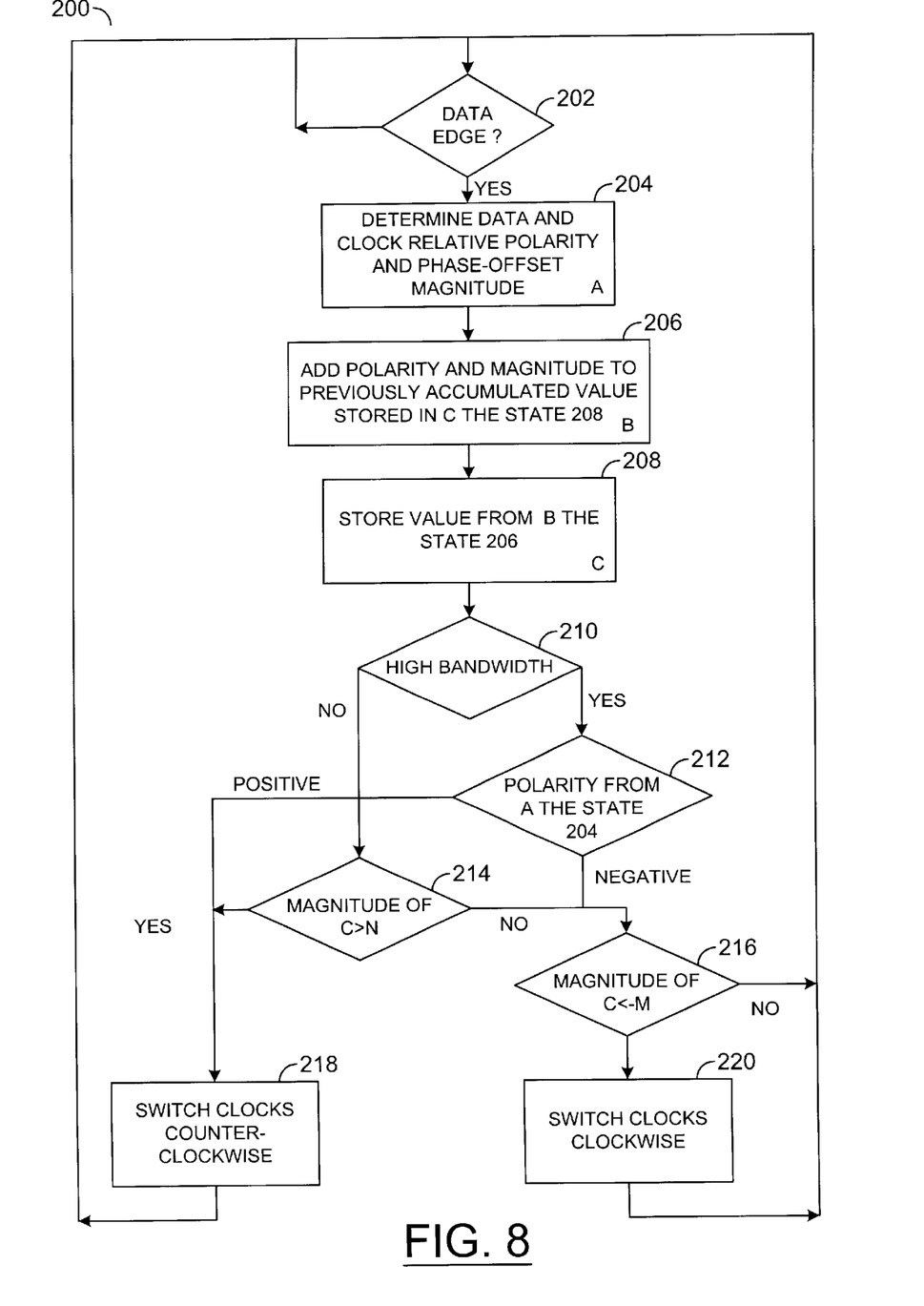
FIG. 8 is a flow diagram illustrating an example operation of a linearized digital phase-locked loop implemented in accordance with the present invention.

Referring to FIG. 8, a method (or process) 200 is shown. The method 200 generally comprises a decision state 202, a state 204, a state 206, a state 208, a decision state 210, a decision state 212, a decision state 214, a decision state 216, a state 218 and a state 220. The decision state 202 generally determines if a data edge is present. If a data edge is not present, the decision state 202 continues to check for such a condition. If a data edge is present, the state 204 determines a relative polarity and phase-offset magnitude for the data and clock. The state 206 adds the polarity and magnitude to a previously accumulated value stored in the state 208. Next, the state 208 stores the next accumulated value from state 206. The decision state 210 determines if a high bandwidth condition has occurred. If such high bandwidth condition has occurred, the state 212 determines the polarity from the state 204. If the polarity is positive, the state 218 switches clock counter clockwise and returns to the state 212. If the state 212 determines that the polarity from the state 204 is negative, the state 216 determines if the magnitude in the state 208 is less than –M. If so, the method 200 returns to the state 202. If the magnitude of the value of the state 208 is less than –M, the state 220 switches the clocks clockwise and returns to the state 202.

Referring back to the state 210, if a high bandwidth condition is not detected, the state 214 determines if the magnitude of the state 208 is greater than n. If so, the method moves to the state 218 where the clocks are switched counter clockwise and the method 200 returns to the state 202. If the magnitude stored in the state 208 is not greater than n, the method moves to the state 216.

The function performed by the flow diagram of FIG. 6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. An apparatus for determining a state of a plurality of clock signals, comprising:
   a circuit configured to (i) store a state of each of said plurality of clock signals upon an edge of a data signal and (ii) generate an offset value and a polarity value based upon said stored state of each of said plurality of clock signals.

2. The apparatus according to claim 1, wherein said circuit comprises one or more storage elements.

3. The apparatus according to claim 2, wherein said one or more storage elements comprise a register.

4. The apparatus according to claim 2, wherein said one or more storage elements comprise a flip-flop.

5. The apparatus according to claim 2, wherein said one or more storage elements comprise a D-type flip-flop.

6. The apparatus according to claim 2, wherein said circuit further comprises an encoder circuit configured to generate an output in response to information stored in said one or more storage elements.

7. The apparatus according to claim 6, wherein said output comprises an offset value and a polarity value based upon said information stored in said one or more storage elements.

8. The apparatus according to claim 7, wherein said apparatus comprises a phase detector of a digital phase-locked loop.

9. An apparatus for determining a state of a plurality of clock signals, comprising:

means for detecting an edge of a data signal;

means for storing said state of each of said plurality of clock signals in response to said edge of said data signal; and means for generating an offset value and a polarity value based upon said stored state of each of said plurality of clock signals.

10. A method for determining a state of a plurality of clock signals, comprising the steps of:

(A) detecting an edge of a data signal;

(B) storing said state of each of said plurality of clock signals in response to said edge of said data signal; and (C) generating an offset value and a polarity value based upon said stored state of each of said plurality of clock signals.

11. The method according to claim 10, wherein step (A) comprises the sub-step of:

(A-1) presenting said data signal to a clock input of one or more storage elements.

12. The method according to claim 11, wherein step (B) comprises the sub-step of:

(B-1) presenting said plurality of clock signals to data inputs of said one or more storage elements.

13. The method according to claim 11, wherein said one or more storage elements comprise a register.

14. The method according to claim 11, wherein said one or more storage elements comprise a flip-flop.

15. The method according to claim 11, wherein said one or more storage elements comprise a D-type flip-flop.

16. The method according to claim 13, wherein step (C) is performed using an encoder circuit configured to generate an output in response to information stored in said one or more storage elements.

17. The method according to claim 13, further comprising the step of:

(D) linearizing a digital phase-locked loop using said offset value and said polarity value.

18. An apparatus for determining a state of a plurality of clock signals, comprising:

a circuit configured to store a state of each of said plurality of clock signals upon an edge of a data signal in one or more storage elements; and an encoder circuit configured to generate an output comprising an offset value and a polarity value in response to information stored in said one or more storage elements.

19. The apparatus according to claim 18, wherein said circuit is further configured to generate an offset value and a polarity value based upon said stored state of each of said plurality of clock signals.

20. The apparatus according to claim 18, wherein said one or more storage elements comprise a register.

21. The apparatus according to claim 18, wherein said one or more storage elements comprise a flip-flop.

22. The apparatus according to claim 18, wherein said one or more storage elements comprise a D-type flip-flop.

* * * * *